(12) United States Patent
Lin et al.

(10) Patent No.: US 6,603,300 B2
(45) Date of Patent: Aug. 5, 2003

(54) PHASE-DETECTING DEVICE

(75) Inventors: Yu-Wei Lin, Hsin-Tien (TW); Chia-Hsin Chen, Taipei (TW)

(73) Assignee: Via Technologies, Inc., Taipei (TW)

( * ) Notice: Subject to any disclaimer, the term of this patent is extended or adjusted under 35 U.S.C. 154(b) by 0 days.

(21) Appl. No.: 09/989,381

(22) Filed: Nov. 21, 2001

(65) Prior Publication Data

US 2002/0089320 A1 Jul. 11, 2002

(30) Foreign Application Priority Data

Jan. 11, 2001 (TW) ........................................ 90100656 A

(51) Int. Cl.⁷ .............................................. G01R 23/175
(52) U.S. Cl. .................................. 324/76.54; 324/76.52
(58) Field of Search ........................... 324/76.54, 76.41, 324/76.52–76.53, 76.73, 76.77, 76.79; 327/147, 149, 153–161; 375/373–376

(56) References Cited

U.S. PATENT DOCUMENTS 5,815,016 A * 9/1998 Erickson ..................... 327/158

\* cited by examiner

*Primary Examiner*—Christine Oda
*Assistant Examiner*—Amy He
(74) *Attorney, Agent, or Firm*—Rabin & Berdo, P.C.

(57) ABSTRACT

A phase detecting device, including a phase detector, an inversion logic circuit, a latch and an OR logic circuit, is used for detecting the phase difference between a reference signal and a feedback signal and for outputting a delay control signal. The phase detector generates a detected signal according to the status of the feedback signal captured by the reference signal. The inversion logic circuit inverts the detected signal, and the delay device delays the detected signal. The delayed inverted detected signal is then fed into the latch device to generate a latch signal. As the detected signal and the latch signal are fed into the OR logic circuit, the OR logic circuit feeds the delay control signal into the counter so that the delay circuit can generate different delay time, such as T/4, T/2 or 1T, for meeting different signal-delay requirements.

9 Claims, 6 Drawing Sheets

PHASE-DETECTING DEVICE

This application incorporates by reference Taiwanese application Serial No. 90100656, filed on Jan. 11, 2001.

BACKGROUND OF THE INVENTION

1. Field of Invention

The invention relates in general to a detecting device, and more particularly to a phase-detecting device for a delay locked loop (DLL).

2. Description of related art

In order to meet design requirements, signals are delayed in logic circuits. Of various designs of delay circuits, delay locked loop can accurately delay input signals by ¼, ½ or one cycle to meet different requirements for different circuit designs.

FIG. 1 illustrates phase relationship between a reference signal and a delay signal. As shown, the reference signal S is a typical square wave, and the delay signal SD lags the reference signal S by ¼ cycle (T/4). Therefore, the delay signal SD and the reference signal S have the same waveform, but their phases are different by T/4.

FIG. 2 illustrates a block diagram of a delay locked loop. The delay locked loop includes a delay circuit 210, a phase detector 220 and a counter 230, and is used for delaying a reference signal 20. As shown, the delay circuit 210 has the reference signal 20 as input, and determines a delay time based upon a counting signal 23 from the counter 230. Namely, different delay times for the reference signal 20 can be made by different counting signals 23. For example, if the counting signal 23 is 0, the delay time generated by the delay circuit 210 is shortest. By gradually increasing the value of the counting signal 23, the delay time is increased gradually, resulting in the time delay of the reference signal 20.

To further improve the accuracy of the time delay, a feedback loop is implemented. Practically, the counting signal 23 is set to 0 at the beginning such that the reference signal 20 is delayed by a shortest delay time. The delayed reference signal 20 is feedback to the phase detector 220 for detecting a phase difference between the reference signal 20 and the feedback signal 25. Accordingly, the phase detector 220 can determine whether the delay time for the reference signal 20 satisfies the design requirements. According to the detected result, the phase detector 220 feeds a delay control signal 22 into the counter 230 so that the value of the counting signal 23 is increased. The counting signal 23 is then fed into the delay circuit 210 so as to increase the delay time of the reference signal 20. As the delay time is increased, the delayed reference signal 20 is further feedback to the phase detector 220. The delay time is continuously adjusted until the delay circuit 210 generates a required delay time. Therefore, the required delay time for the reference signal 20 can be obtained.

In addition, with the circuit structure based on the circuit in FIG. 2, an approach to the obtaining of a signal at a frequency of 100 MHz with a delay time of ¼ cycle is described as follows. That is, a signal with a delay time of 2.5 ns is to be generated according to the approach described above. FIG. 3 shows a block diagram of the delay locked loop. First, a reference signal 30 with a frequency of 200 MHz is used for delaying and adjusting. The reference signal 30 is inverted to a reference signal 30a by an inversion logic circuit 310, and then the inverted reference signal 30a is feedback to the phase detector 220. Through a buffer 320, a feedback signal 35 is buffered as a feedback signal 35a and then feedback to the phase detector 220. According to a phase difference between the feedback signal 35a and the reference signal 30a, the phase detector 220 generates a delay control signal 32 and outputs it to the counter 230 for adjusting a delay time for the reference signal 30 until the delay circuit 210 generates a correct delay time. Since the process has been explained previously, the detailed description will not be made for the sake of brevity. A timing diagram is shown next for further describing timing relationship among the signals.

FIG. 4 shows a timing diagram of the reference signal and the feedback signal in FIG. 3. Referring FIGS. 3 and 4, the reference signal 30a and the feedback signal 35a are inputted to the phase detector 220 at the same time. Because the feedback signal 35 is generated by delaying the reference signal 30 through the delay circuit 210, the phase of the feedback signal 35a lags behind the phase of the reference signal 30a, assuming the response times for both of the inversion logic circuit 310 and the buffer 320 are equal. The phase detector 220 captures the level (voltage amplitude) of the feedback signal 35a at the rising edge r0 of the reference signal 30a. For the waveforms shown in FIG. 4, the feedback signal 35a captured is a logic "1". By proper design, the delay control signal 32 can be set to a logic "1" when the phase detector 220 captures a logic "1" signal. The delay control signal 32 is inputted to the counter 230 to increase the counting value of the counting signal 33; thereby, the delay time for the reference signal is extended. Accordingly, the phase difference between the feedback signal 35a and the reference signal 30a is increased as the delay time for the reference signal 30 is increased. According to the phase difference between the feedback signal 35a and the reference signal 30a, the rising edge r5 of the feedback signal 35a is shifted to right. Next, the phase detector 220 further detects the level of the feedback signal 35a at the rising edge r0 of the reference signal 30a. If the captured signal is in a logic "1" state, the delay control signal 32 is set to the logic "1" state again to increase the counting value of the counting signal 33, whereby the delay time for the reference signal 30 is further delayed. Therefore, the phase difference between the feedback signal 35a and the reference signal 30a is increased further. Namely, the rising edge r5 of the feedback signal 35a is shifted to right further. Accordingly, by the control scheme above, once the rising edge of the reference signal 30a is detected to be the logic "1" state, the delay time for the reference signal 30 is increased further and the feedback signal 35 is lagged behind the reference signal 30.

As the foregoing description, the rising edge of the feedback signal is gradually shifted to right as the delay time for the reference signal is gradually increased. As the rising edge of the feedback signal is further shifted to right until the rising edge r5' (shown in FIG. 4) slightly lags behind the rising edge r0, the signal detected at the rising edge r0 is a logic "0" instead of logic "1". By proper design, when the signal with the logic "0" state detected by the phase detector 220, the delay control signal 32 can be set to logic "0". The counting value of the counting signal 33 is then decreased so that the delay time generated by the delay circuit 210 is decreased. As a result, the rising edge r5 leads the rising edge r0 so that the delay control signal 32 becomes logic "1" and the counting value of the counting signal 33 is increased. By repeating the foregoing process, the rising edges r0 and r5 are kept within a very short interval. As shown, the rising edges r0 and r5' are apart by about ½ cycle.

According to the foregoing description, the delay time can be fixed at about ½ cycle (T/2) by the delay locked loop. Namely, when the frequency of the reference signal 30 is 200 MHz, the delay time is 2.5 ns. It should be noted that according to the original purpose it intends to delay a signal with a frequency of 100 MHz by T/4. However, in practice, the reference signal 30 with a frequency of 200 MHz is delayed to obtain a delay time of 2.5 ns. Once the delay time is determined, the delay time of 2.5 ns is equivalent to the case when a signal with a frequency of 100 MHz is delayed by T/4. Therefore, if a signal with a frequency of 100 MHz is inputted to the delay circuit 210, the signal will be delayed by T/4, which meets the design requirement. Moreover, the delay locked loop has a save lock range SR. That is, as the feedback signal 35a is within the save lock range SR, the phase lock can be completed by the phase detector 220 and the delay time can be properly obtained.

FIG. 5 shows a block diagram of a delay locked loop for generating a delay time of one cycle. The delay locked loop comprises a delay circuit 210, a phase detector 220 and a counter 230. According to a reference signal 50 and a feedback signal 55, the phase detector 220 outputs a delay control signal 52 to the counter 230 to adjust the counting value of a counting signal 53; thereby, the delay circuit 210 generates the feedback signal 55 with a required delay time. The delay process is discussed in detail as follows.

FIG. 6 shows a timing diagram of the reference 50 and the feedback signal 55 in FIG. 5. Referring to FIGS. 5 and 6, the reference signal 50 and the feedback signal 55 are inputted to the phase detector 220 at the same time. Since the feedback signal 55 is generated by delaying the reference signal 50 through the delay circuit 210, the phase of the feedback signal 55 lags behind the phase of the reference signal 50. Similarly, using the rising edge r50 of the reference signal 50, the phase detector 220 detects the status of the feedback signal 55 so as to adjust a delay time. As shown in FIG. 6, since the feedback signal 55 lags behind the reference signal 50, the phase detector 220 detects that the feedback signal 55 is in a logic "0" state. According to the foregoing description, when a logic "0" state is detected by the phase detector 220, the counting value of the counting signal 33 is decreased. If the counting signal 33 reaches its minimum value at the beginning, the delay time of the feedback signal 55 generated by the delay circuit 210 is kept and not changed. Therefore, the reference signal 50 cannot be delayed by one cycle. The delay locked loop has a failure phase-lock range FR. Namely, once the feedback signal 55 is within the FR range, the objective of phase locking cannot be achieved and the circuit cannot function properly.

Accordingly, the drawback of the conventional circuit configuration is that it has to provide two different delay locked loops for providing two different delay cycles, such as T/4 and 1T. It is impossible to provide two different delay times using the same delay locked loop. Therefore, the occupied circuit area is doubled, and cost and complexity are increased.

SUMMARY OF THE INVENTION

This invention provides a phase detecting device having a phase lock loop capable of providing different delay times, such as T/4, T/2 and 1T, and thus reducing the cost and circuit complexity.

From the foregoing description, an object of this invention is to provide a phase detecting device. The phase detecting device is used to generate a delay control signal according to a phase difference between a reference signal and a feedback signal, and then a delay control signal is fed into a counter. The counter adjusts a counting value of a counting signal according to the delay control signal so that the delay circuit generates various delay times to meet different requirements. The phase detecting device includes a phase detector, an inversion logic circuit, a latch and an OR logic circuit. The phase detector is used to generate a detected signal according the status of the feedback signal captured by the reference signal. The inversion logic circuit inverts the detected signal and outputs an inverted detected signal that is fed into the delay device to delay the inverted detected signal. The delayed inverted detected signal is then fed into the latch device. On receiving the inverted detected signal, the latch device generates a latch signal and feeds the latch signal into the OR logic circuit. The OR logic circuit further receives the detected signal. The OR logic circuit feeds the delay control signal into the counter according to the status of the detected signal and the latch signal. The counter can therefore adjust the counting signal so that the delay circuit can provide different delay time, such as T/4, T/2 or 1T, for different signal-delay requirements.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENT

Figure 7:
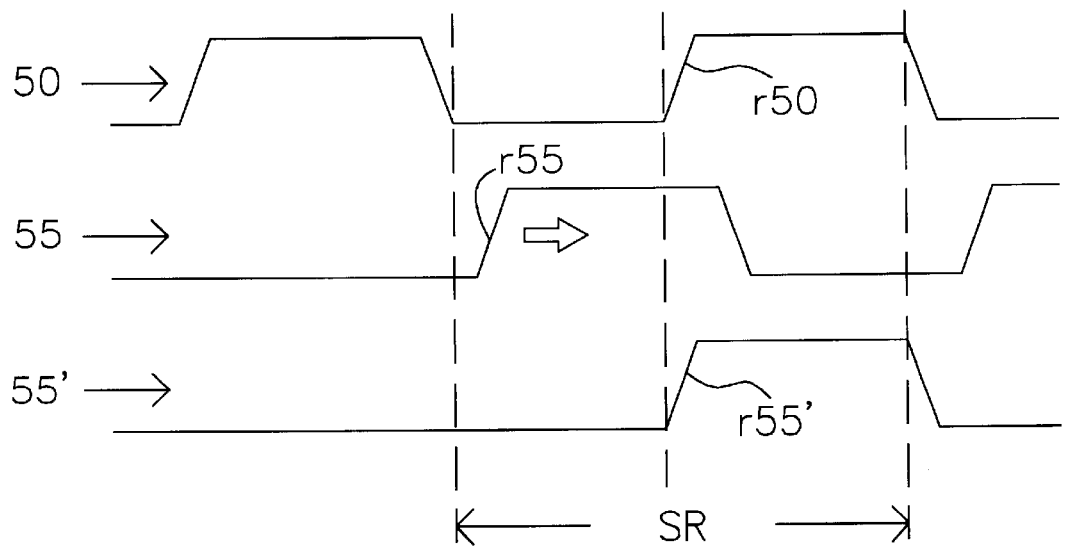
FIG. 7 shows a timing diagram when the reference signal and the feedback signal are locked at proper phases.

To solve the foregoing issues, the invention provides a scheme that a delay time of the reference signal 50 is increased first if the phase detector 220 detects that the feedback signal 55 is in a logic "0" state, so that the feedback signal 55 is shifted to right within the safe lock range SR, and then the phase detector 220 detects the phase difference between the reference signal 50 and the feedback signal 55 so as to complete the phase lock procedure, as shown in FIG. 7. FIG. 7 shows a timing diagram when the reference signal 50 and the feedback signal 55 are phase-locked at a desired phase. Referring to FIG. 7, for completing the phase lock procedure, the feedback signal 55 is shifted to right first so that its rising edge r55 is within the safe lock range SR. As the rising edge r55 falls within the safe lock range SR, the phase detector 200 uses the rising edge r50 of the reference signal 50 to detect the status of the feedback signal 55. Accordingly, a logic "1" state of the feedback signal 55 can be properly detected and the counting value of the counting signal 53 is thus increased so that the delay time of the reference signal 50 is increased. The feedback signal 55 is continuously shifted to right until its waveform appears as the waveform 55' shown in FIG. 7. As shown in FIG. 7, after the delay time is determined, it is a 1T delay learned from the phase difference between the reference signal 50 and the feedback signal 55. Thus, the design requirements are met. In summary, if the reference signal 50 is to be delayed by a delay time of 1T, the key point is that it has to set the rising edge r55 of the feedback signal 55 to fall within the safe lock range SR and then the phase detector 220 adjusts the counting value of the counting signal 53 to make the circuit function properly. Therefore, it is critical to design the circuit so that the rising edge r55 of the feedback signal 55 falls within the safe lock range SR.

Figure 1:
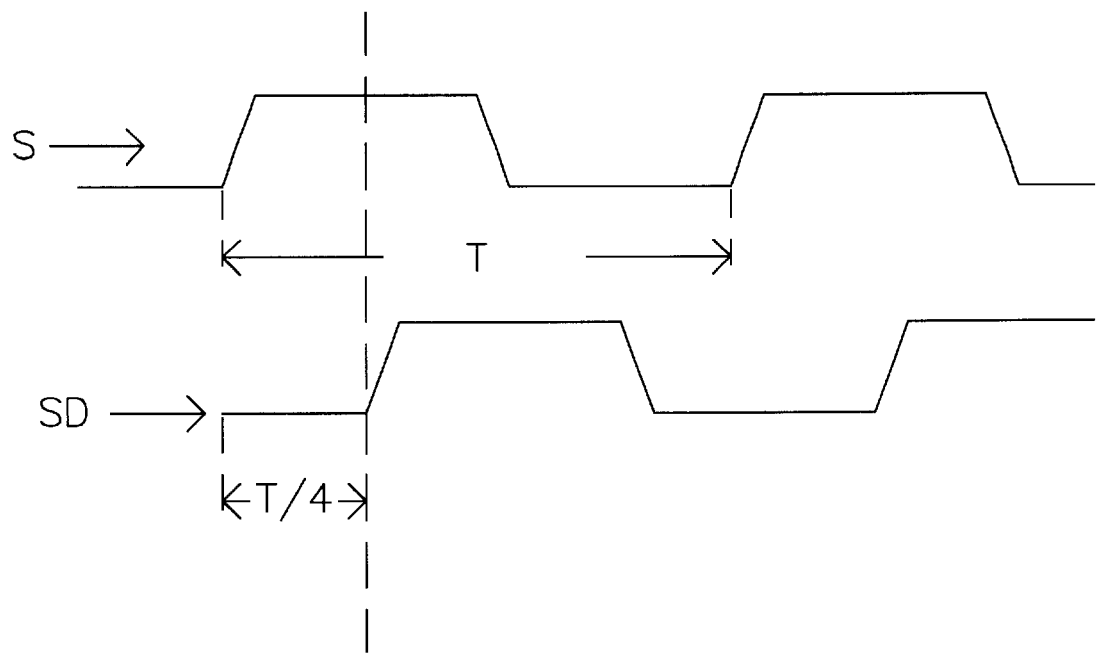
FIG. 1 illustrates the phase relationship between a reference signal and a delay signal.
Figure 2:
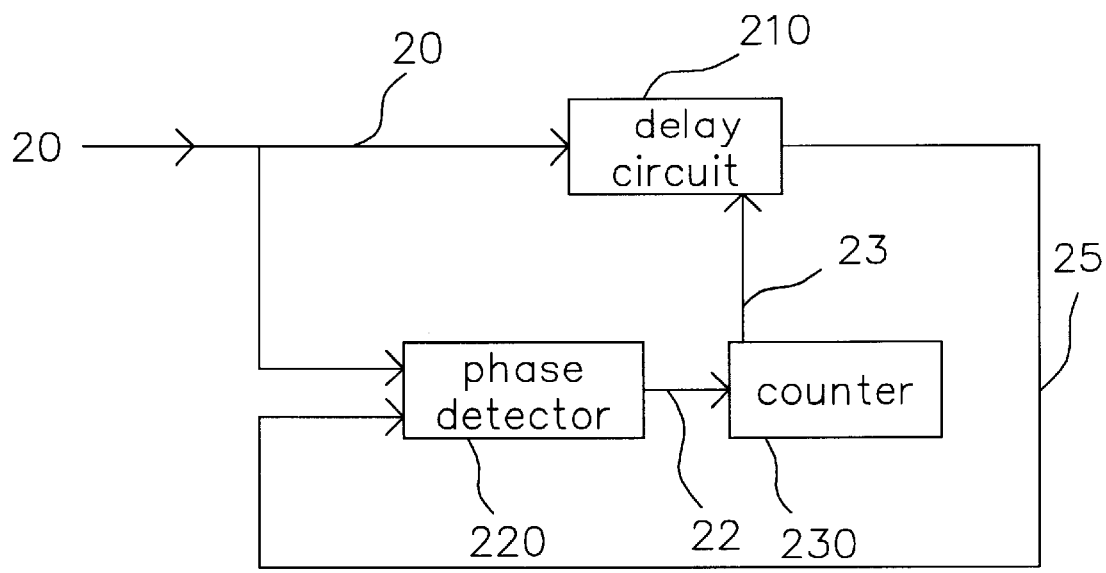
FIG. 2 illustrates a block diagram of a delay locked loop.
Figure 3:
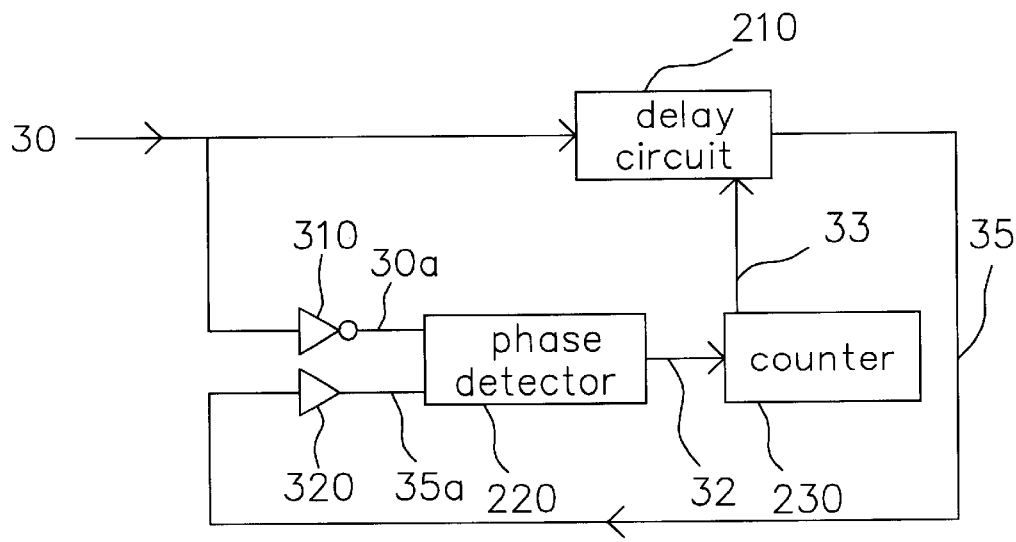
FIG. 3 shows a block diagram of the delay locked loop for delaying T/4 cycle.
Figure 4:
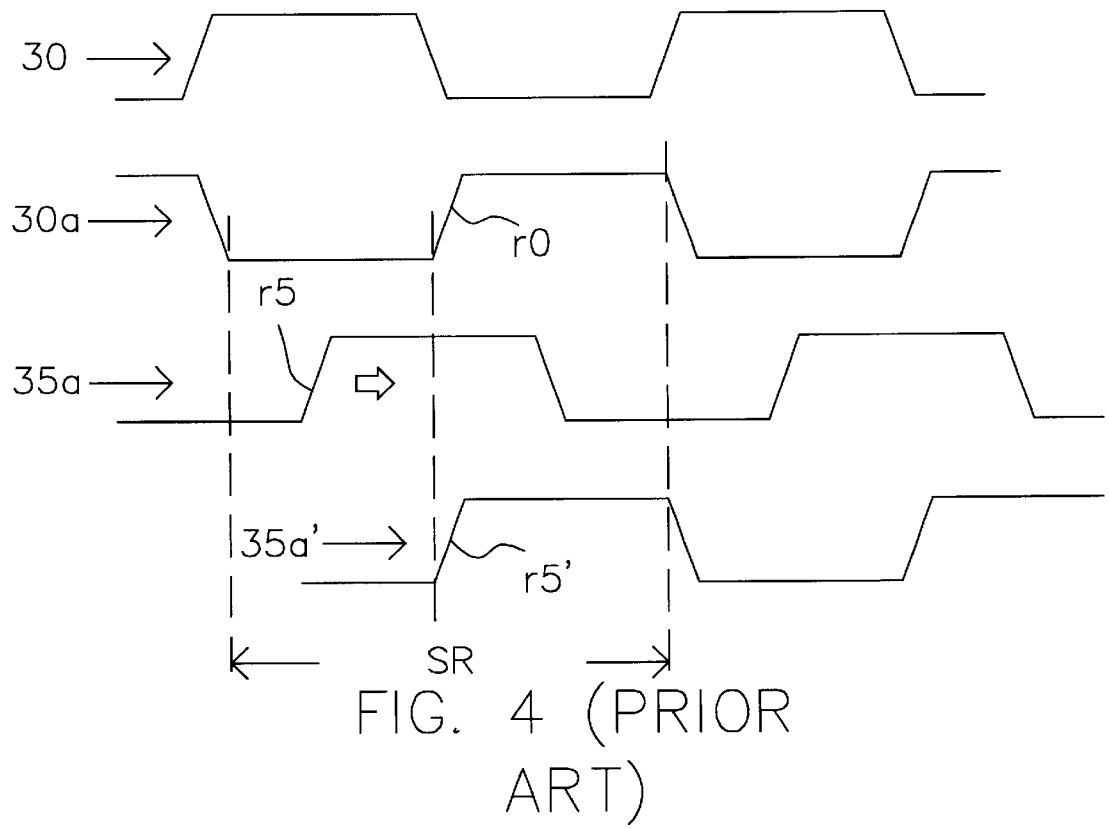
FIG. 4 shows a timing diagram of the reference signal and the feedback signal in FIG. 3.
Figure 8:
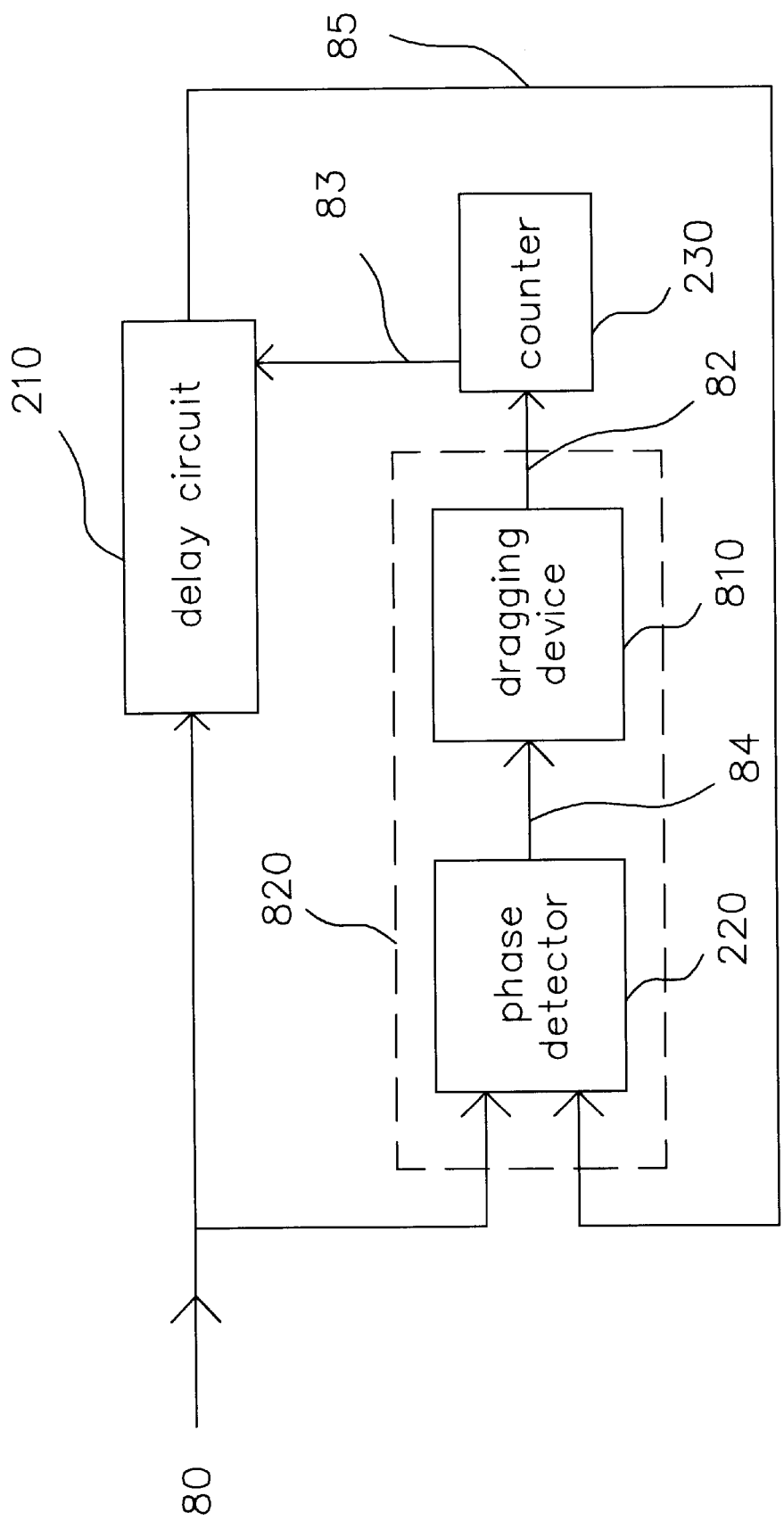
FIG. 8 shows a block diagram of a delay locked loop according to one preferred embodiment of the invention.

FIG. 8 shows a block diagram of a delay locked loop according to one preferred embodiment of the invention. The delay locked loop includes a phase detecting device 820. The phase detecting device 820 is used for comparing the phase between a reference signal 80 and a feedback signal 85 so as to adjust a delay time of the reference signal 80. Compared with the conventional one, the phase detecting device 820 shown in FIG. 8 is suitable for a 1T delay, in addition to the delay times of T/4 and T/2, if I/O are connected properly (see FIG. 3). Thus, a delay control signal 82 generated by the phase detecting device 820 satisfies different delay-time requirements of the delay circuit 210. The implementation will be described in detail below.

Figure 5:
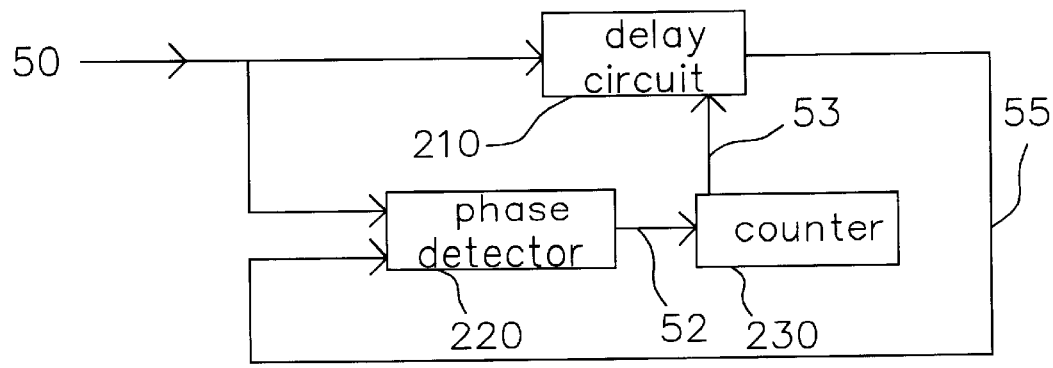
FIG. 5 shows a block diagram of a delay locked loop for generating a delay time of one cycle.
Figure 6:
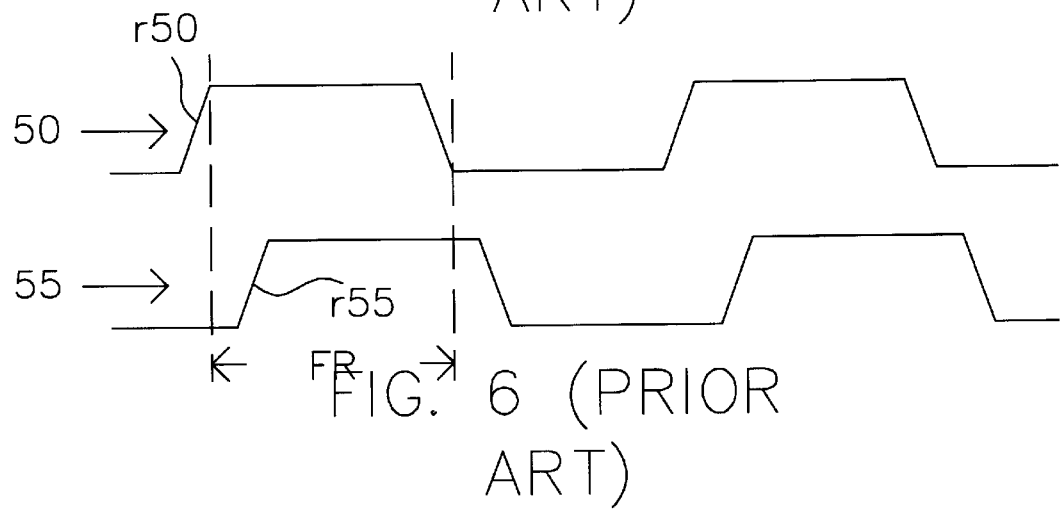
FIG. 6 shows a timing diagram of the reference 50 and the feedback signal 55 in FIG. 5.

As shown in FIG. 8, the phase detecting device 820 includes a phase detector 220 and a dragging device 810. The function of the phase detector 220 has been discussed in detail above, and no additional description is made hereinafter. When a delay time of 1T is required, an initial value of a detected signal 84 outputted from the phase detector 220 is a logic "0" due to the operation of the delay locked loop according to the invention (see descriptions corresponding to FIGS. 5 and 6 for details). The feature of the invention is that the logic "0" of the detected signal 84 can make the dragging device 810 output a delay control signal 82 of logic "1". As the delay control signal 82 is fed into the counter 230, the delay time of the reference signal 80 is increased and the feedback signal 85 is shifted to right. That is, under the condition that the phase detector 220 cannot properly adjust the delay time, the dragging device 810 can first be used to increase the delay time for temporally replacing the phase detector 220. When the feedback signal falls within the safe lock range, the phase detector 220 can output a logic "1" and then the dragging device 810 is disabled. As the dragging device 810 is disabled, the detected signal 84 is served as the delay control signal 82 again and is fed into the counter 230 to continuously adjust the delay time.

Figure 9:
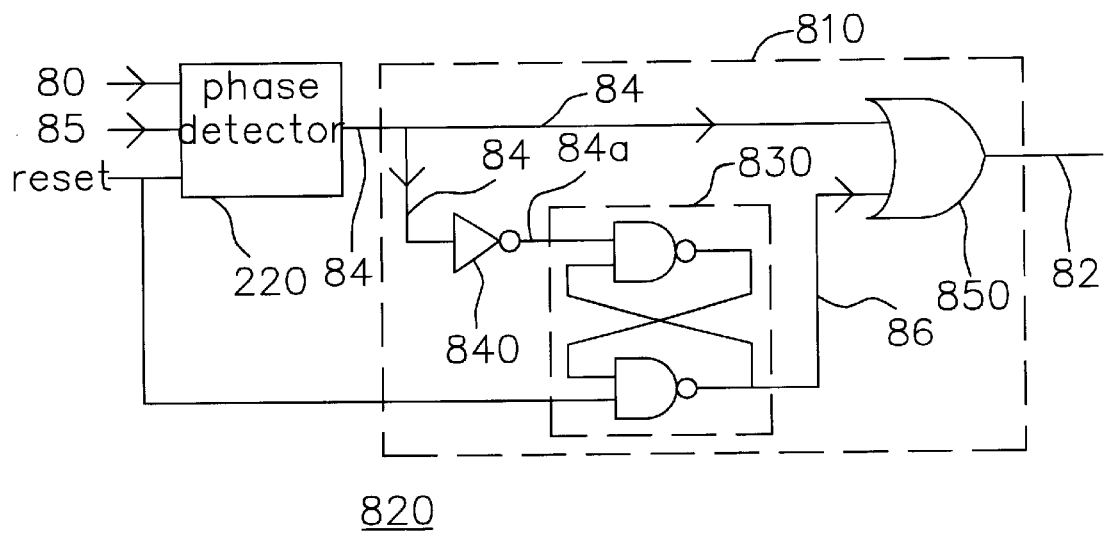
FIG. 9 shows a circuit diagram of the phase detecting device in FIG. 8.

FIG. 9 shows a circuit diagram of the phase detecting device in FIG. 8. The phase detecting device 820 includes a phase detector 220 and a dragging device 810, wherein the dragging device 810 includes an inversion logic circuit 840, a latch device 830 and an OR logic circuit 850. As shown, the inversion logic circuit 840 is coupled to the phase detector 220 and is used to invert the detected signal 84 and outputs an inverted detected signal 84a. Next, the inverted detected signal 84a is fed into the latch device 830, and then according to the status of the inverted detected signal 84a, the latch device 830 feeds a latch signal 86 into the OR logic circuit 850. As the OR logic circuit 850 receives the detected signal 84 and the latch signal 86, the delay control signal 82 outputted from the OR logic circuit 850 becomes logic "1" if the detected signal 84 or the latch signal 86 is logic "1". Only if both of the detected signal 84 and the latch signal 86 are logic "0", the delay control signal 82 becomes logic "0". According to the delay control signal 82 fed into the counter 230, the counting value of the counting signal 83 can be adjusted to adjust the delay time. A timing diagram for each related signal is depicted in detail below.

Figure 10:
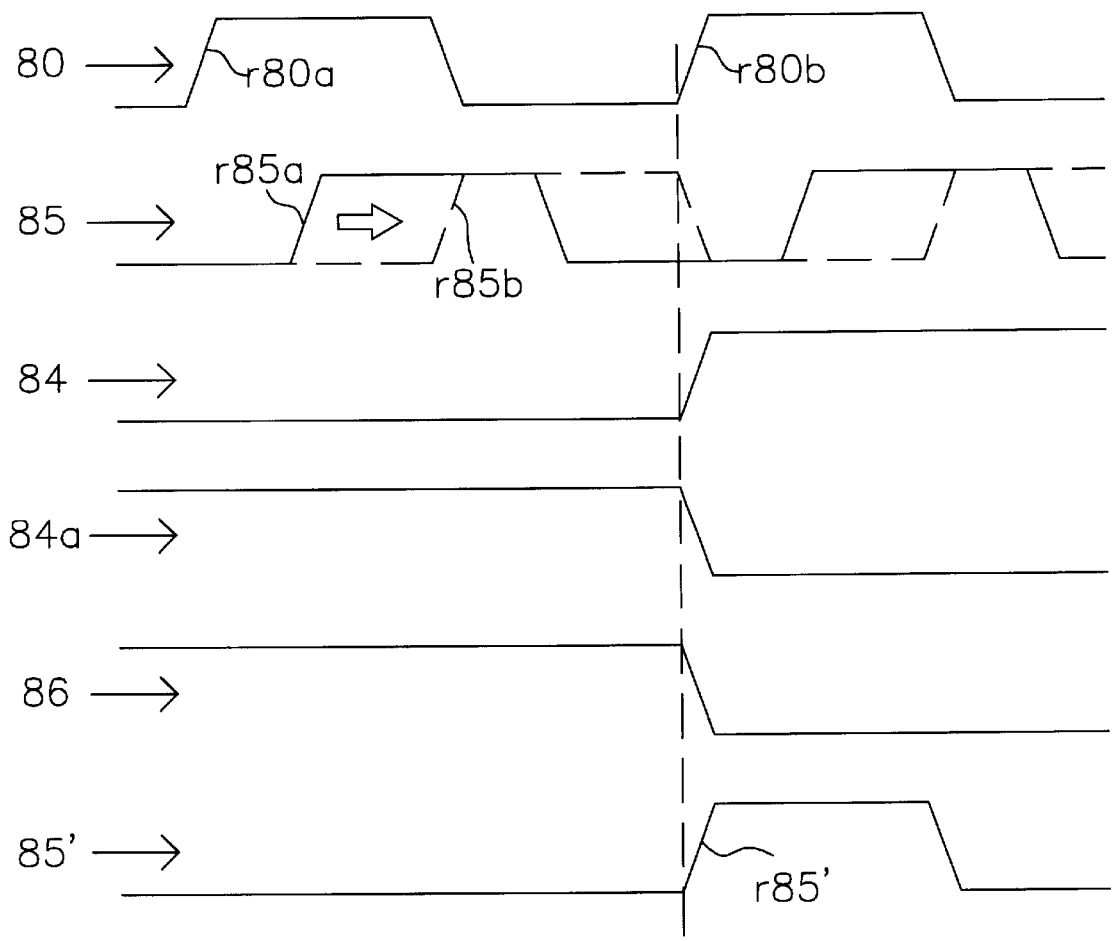
FIG. 10 shows a timing diagram for illustrating signals shown in FIG. 9.

FIG. 10 shows a timing diagram for illustrating signals shown in FIG. 9. When the system is reset, the control signal 86 is set to logic "1". As the reference signal 80 and the feedback signal 85 are fed into the phase detector 220, the phase detector 220 detects the status of the feedback signal 85 at the rising edge r80a of the reference signal 80. At this time, a logic "0"state is detected and therefore the detected signal 84 is logic "0". Next, by the inversion logic circuit 840, the detected signal 84 is inverted and the inverted detected signal 84a is then fed into the latch device 830. At this time, because the inverted detected signal 84a is logic "1", the latch signal 86 outputted from the latch device 830 is still kept logic "1", and then the latch signal 86 is fed into the OR logic circuit 850. As shown, the detected signal 84 and the latch signal 86 are the inputs of the OR logic circuit 850. If the detected signal 84 is logic "0" and the latch signal 86 is logic "1", the delay control signal 82 becomes logic "1" and is fed into the counter 230 so as to increase the delay time. As described above, increasing the delay time means that the rising edge r85a of the feedback signal 85 is shifted to the right. In addition, the latch device 86 is involved in the increasing of the delay time until logic "1" of the feedback signal 85 is detected at the rising edge of the reference signal 85. For example, a dashed waveform as shown in the Figure of feedback signal 85 of FIG. 10 represents the waveform of the feedback signal 85 being shifted to the right. At the rising edge r80b of the reference signal 80, the feedback signal 85 represented by the dashed waveform has been in transition from logic "0" to logic "1" and the phase detector 220 detects a logic "1" of the feedback signal 85. Therefore, the detected signal 84 is also in transition to logic "1". Next, through the inversion logic circuit 840, the inverted detected signal 84a is fed into the latch device 830. Meanwhile, the inverted detected signal 84a is logic "0" so that the latch device 830 is disabled and the latch signal 86 is logic "0". As the detected signal 84 and the latch signal 86 are fed into the OR logic circuit 850, the delay control signal 82 is still logic "1", and the delay time is thus increased continuously. Afterwards, it should be noted that the latch device 830 finishes its own task, and the following adjustment to the delay time is performed by the phase detector 220 without the help of the latch device 830. Since the feedback signal 85 has fallen within the safe lock range SR, the rising edge r85b of the feedback signal 85 is gradually shifted to right by the operation of the circuit and the feedback signal 85 can be represented as the feedback signal 85' shown in FIG. 10. The rising edge r85' of the feedback signal 85' is substantially close to the rising edge r80b of the reference signal 80. Accordingly, from the phase relationship of the reference signal 80 and the feedback signal 85', the delay time is 1T and the design requirement is met.

Figure 11:
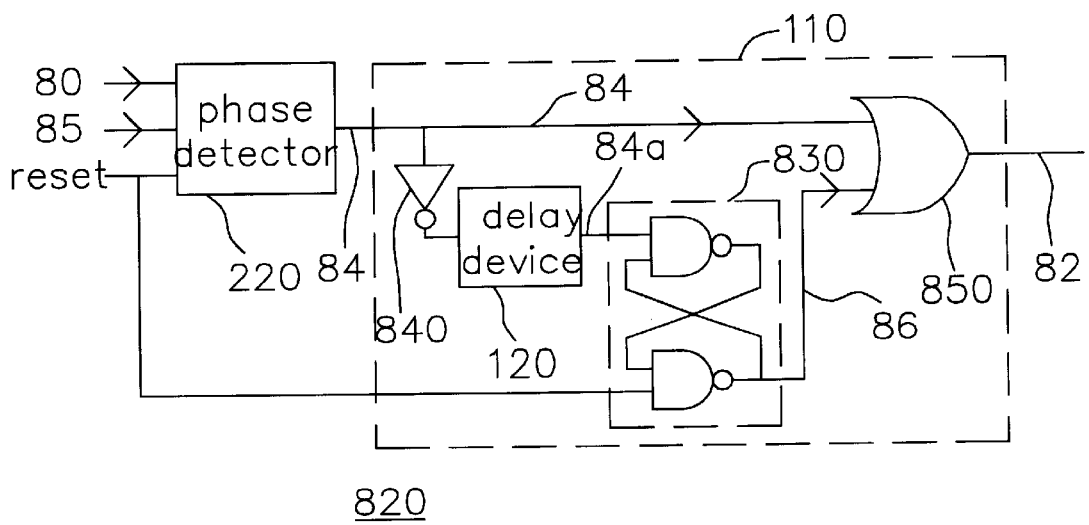
FIG. 11 shows another example of the phase detecting device of the invention.
Figure 12:
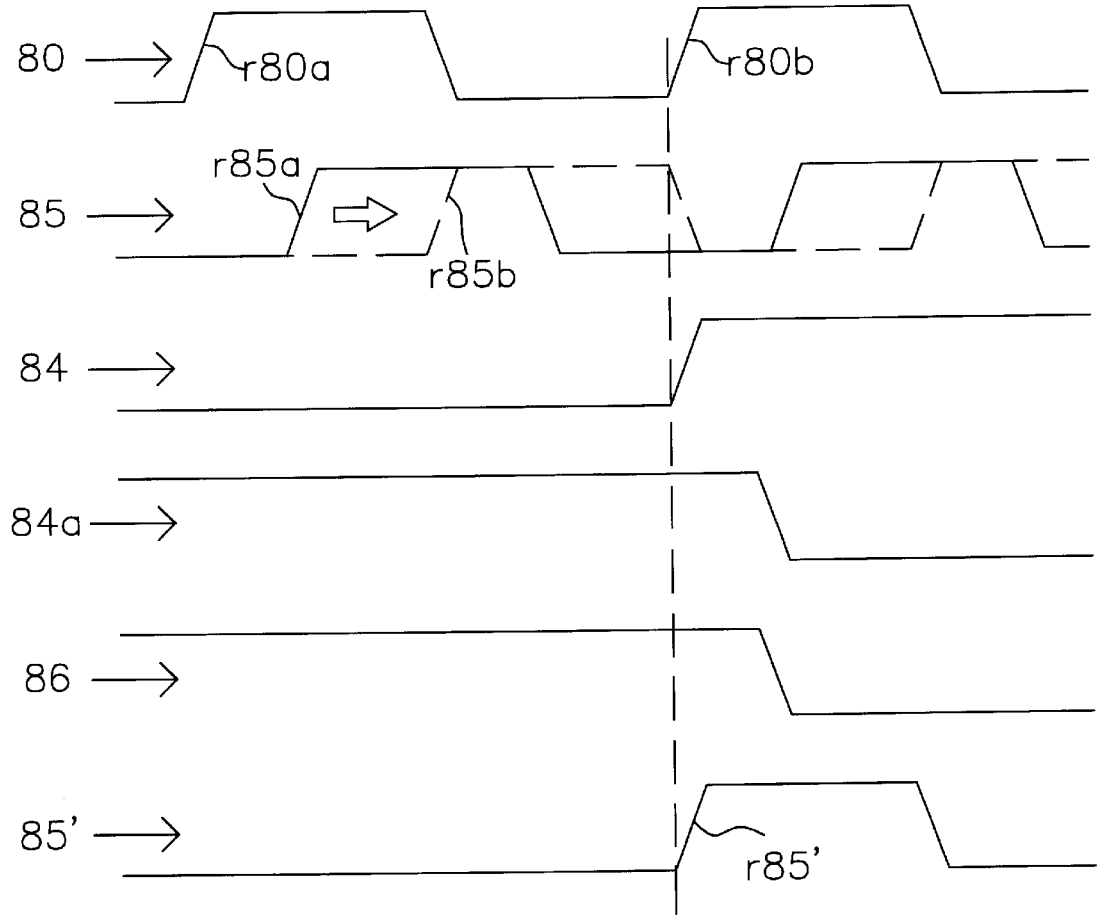
FIG. 12 shows a timing diagram, illustrating the signals in FIG. 11.

FIG. 11 shows another example of the phase detecting device according to the invention. In FIG. 11, dragging device 110 includes a delay device 120 which is coupled between the inversion logic circuit 840 and the latch device 830. Through the delay device 120, a delayed inverted detected signal 84a is fed into the latch device 830. It should be noted that the purpose for delaying the inverted detected signal 84*a* is to obtain the detected signal 84 with a stable logic "1". FIG. 12 shows a timing diagram illustrating the signals in FIG. 11. During operation, the detected signal 84 becomes unstable when the rising edge of the feedback signal 85 is close to the falling edge of the reference signal 80. Thus, for avoiding malfunction of the circuit, the detected signal 84 cannot be used as the delay control signal until the detected signal 84 becomes stable. By the delay device 120, the inverted detected signal 84*a* can be kept in the logic "1" state before the detected signal 84 becomes stable so that the delay control signal can be stabilized in the logic "1" state and cannot be affected by the unstable status of the detected signal 84. It should be noted that the delay time of the delay device 120 must be larger than the unstable time of the detected signal 84. Therefore, the detected signal 84 has been stable when the signal fed into the latch device 830 (i.e., the inverted detected signal 84*a*) changes its state. In other words, when the latch device is disabled, the detected signal 84 has been stable and can be used as the delay control signal 82 for the adjustment to the delay time.

According to the foregoing phase detecting device according to the invention, when the delay locked loop is required to generate a delay time of T/4 or T/2, the initial status of the detected signal can make the circuit operate in a stable manner because the feedback signal falls within the safe lock range SR at the beginning. Besides, when the delay locked loop is required to generate a delay time of 1T, the dragging device causes the feedback signal to fall within the safe lock range SR and then the phase detector is used to adjust the delay time, thereby generating the delay time of 1T. Through the phase detecting device according to the invention, a delay circuit can generate various delay times, such as T/4, T/2, or 1T. Thus, the occupied area of circuit is reduced, and the cost and circuitry complexity are also reduced.

It should be noted that in the embodiment an RS latch is used as an example to describe the latch device 830. However, those skilled in the art can use other circuits to implement the function of the latch device.

While the invention has been described by way of example and in terms of the preferred embodiment, it is to be understood that the invention is not limited to the disclosed embodiment. To the contrary, it is intended to cover various modifications and similar arrangements and procedures, and the scope of the appended claims therefore should be accorded the broadest interpretation so as to encompass all such modifications and similar arrangements and procedures.

What is claimed:

1. A phase-detecting device for generating a delay control signal to delay a reference signal by different delay times according to said delay control signal, the phase-detecting device comprising:

a phase detector for detecting a phase difference between said reference signal and a a feedback signal and then outputting a detected signal; and a dragging device, coupled to said phase detector, for outputting said delay control signal according to said detected signal so as to adjust a delay time of said reference signal, wherein said dragging device comprises:

an inversion logic circuit, coupled to said phase detector, for inverting said detected signal and outputting an inverted detected signal;

a latch device, coupled to said inversion logic circuit, for outputting a latch signal according to said inverted detected signal; and an OR logic circuit, coupled to said phase detector and said latch device, for outputting said delay control signal according to said detected signal and said latch signal.

2. The phase-detecting device of claim 2, wherein said latch device is an RS latch.

3. The phase detecting device of claim 1, in combination with a counter that receives the delay control signal, and a delay circuit that receives an output signal of the counter and the reference signal, the delay circuit outputting the feedback signal.

4. A phase-detecting device for generating a delay control signal to delay a reference signal by different delay times according to said delay control signal, the phase-detecting device comprising:

a phase detector for detecting a phase difference between said reference signal and a feedback signal and then outputting a detected signal; and a dragging device, coupled to said phase detector, for outputting said delay control signal according to said detected signal so as to adjust a delay time of said reference signal;

wherein the dragging device can first be used to increase the delay time of the reference signal for temporally replacing the phase detector, then when the feedback signal falls within a safe lock range, the dragging device is disabled and the detected signal is served as the delay control signal; and wherein said dragging device comprises:

an inversion logic circuit, coupled to said phase detector, for inverting said detected signal and outputting an inverted detected signal;

a delay device, coupled to said inversion logic circuit, for delaying said inverted detected signal;

a latch device, coupled to said delay device, for outputting a latch signal according to said delayed inverted detected signal; and an OR logic circuit, coupled to said phase detector and said latch device, for outputting said delay control signal according to said detected signal and said latch signal.

5. The phase-detecting device of claim 4, wherein said latch device is an RS latch.

6. A phase-detecting device for generating a delay control signal and generating different delay times according to said delay control signal, said phase-detecting device comprising:

a phase detector for detecting a phase difference between a reference signal and a feedback signal and then outputting a detected signal;

an inversion logic circuit, coupled to said phase detector, for inverting said detected signal to output an inverted detected signal;

a latch device, coupled to said inversion logic circuit, for outputting a latch signal according to said inverted detected signal; and an OR logic circuit, coupled to said phase detector and said latch device for outputting said delay control signal according to said detected signal and said latch signal.

7. The phase-detecting device of claim 6, wherein said latch device is an RS latch.

8. A phase-detecting device which generates a delay control signal to delay a reference signal by different delay times according to said delay control signal, said phase-detecting device comprising:

a phase detector for detecting a phase difference between said reference signal and a feedback signal and then outputting a detected signal;

an inversion logic circuit, coupled to said phase detector, for inverting said detected signal to output an inverted detected signal;

a delay device, coupled to said inversion logic circuit, for delaying said inverted detected signal;

a latch device, coupled to said delay device, for outputting a latch signal according to said delayed inverted detected signal; and an OR logic circuit, coupled to said phase detector and said latch device for outputting said delay control signal according to said detected signal and said latch signal.

9. The phase-detecting device of claim 8, wherein said latch device is an RS latch.

* * * * *